United States Patent [19]

Shiraishi et al.

[11] Patent Number: 4,634,635
[45] Date of Patent: Jan. 6, 1987

[54] BLACK ORNAMENT

[75] Inventors: Yasuhisa Shiraishi, Tokyo; Takashi Fujita, Ebina; Yoshiharu Ochi, Ichihara; Masahiko Hirose, Yokohama; Katsutarou Ichihara, Kawagoe; Takashi Ishigami, Yokohama, all of Japan

[73] Assignee: Kabushiki Kaisha Toshiba, Kawasaki, Japan

[21] Appl. No.: 655,223

[22] Filed: Sep. 27, 1984

[30] Foreign Application Priority Data

Sep. 30, 1983 [JP] Japan .............................. 58-180392

[51] Int. Cl.$^4$ ........................................... B32B 13/04
[52] U.S. Cl. .................................... 428/446; 428/698; 428/450
[58] Field of Search .................. 428/446, 450, 698; 427/34

[56] References Cited

U.S. PATENT DOCUMENTS

| | | | |
|---|---|---|---|
| 4,252,862 | 2/1981 | Nishida | 428/698 X |
| 4,288,495 | 9/1981 | Terner et al. | 428/450 X |
| 4,310,481 | 1/1982 | Baney | 428/698 X |

Primary Examiner—Nancy A. B. Swisher
Attorney, Agent, or Firm—Schwartz, Jeffery, Schwaab, Mack, Blumenthal & Evans

[57] ABSTRACT

An ornament coated with silicon carbide having black luster which has been formed by chemical vapor deposition aided by D.C. glow discharge using hydrogen, a silicon compound and a hydrocarbon.

The black ornament according to the present invention is very suitable for a case of a watch, a frame of eyeglasses and so on.

7 Claims, 1 Drawing Figure

BLACK ORNAMENT

BACKGROUND OF THE INVENTION

The present invention relates to a black ornament, and more particularly to an ornament which has been coated with silicon carbide (SiC) and has a black luster.

Material which has a black surface-luster is used as an elegant ornament of high valve. Such material is especially suitable for a case of a watch and a frame of eyeglasses.

Heretofore, no such a black ornament has been industrially manufactured. For example, a sintered ceramic of silicon carbide, silicon nitride or the like shows a black color, but the color is sooty and lacks vivid luster, giving the said seramic hardly any value as an ornament.

Furthermore, an attempt at manufacturing a black ornament by coating the surface of a substrate such as stainless steel, hard metal, or the like, with a thin film formed by the process of physical vapor deposition (PVD method, ion plating method) has been made, as is disclosed in Japanese Patent Publication No. 53716/1983 and Japanese Provisional Patent Publication No. 197268/1983. However, it has not necessarily been successful enough to obtain glossy black coating. While Japanese Provisional Patent Publication No. 65357/1980 discloses a process for coating a surface of a substrate with a carbide or a carbonitride by plasma-assisted chemical vapor deposition, it is directed toward forming a coating film of a high-melting-point compound for the purpose of improving abrasion resistance; a black ornament having luster has not thereby been obtained.

Therefore, the industrial development of an ornament with a black luster is strongly desired.

SUMMARY OF THE INVENTION

The present black ornament is characterized in that the surface thereof has been coated with a thin film of silicon carbide.

The object of the present invention is to provide an ornament which can be manufactured on an industrial scale and has a black surface excellent in luster.

The surface of the thin film of silicon carbide according to the present invention shows an elegant black luster as well as higher hardness.

Accordingly, the ornament of the present invention is very useful, having great value as a high-grade black ornament such as a watch, eyeglasses and the like.

BRIEF DESCRIPTION OF THE DRAWING

The drawing shows a schematic diagram of an exemplified apparatus to be used in manufacturing the ornament of the present invention. Reference numerals 1 to 13 indicate the respective elements or parts of the apparatus as shown below.

1: reaction chamber
2: power source for heater
3: heater
4: D.C. power source for glow discharge
5: combination cathode-support
6: anode
7: substrate
8: hydrocarbon cylinder
9: container in bubbler-constant temperature bath for silicon tetrachloride
10: hydrogen cylinder
11: argon cylinder
12: vacuum pump
13: trap

DESCRIPTION OF THE PREFERRED EMBODIMENT

Figure 1:
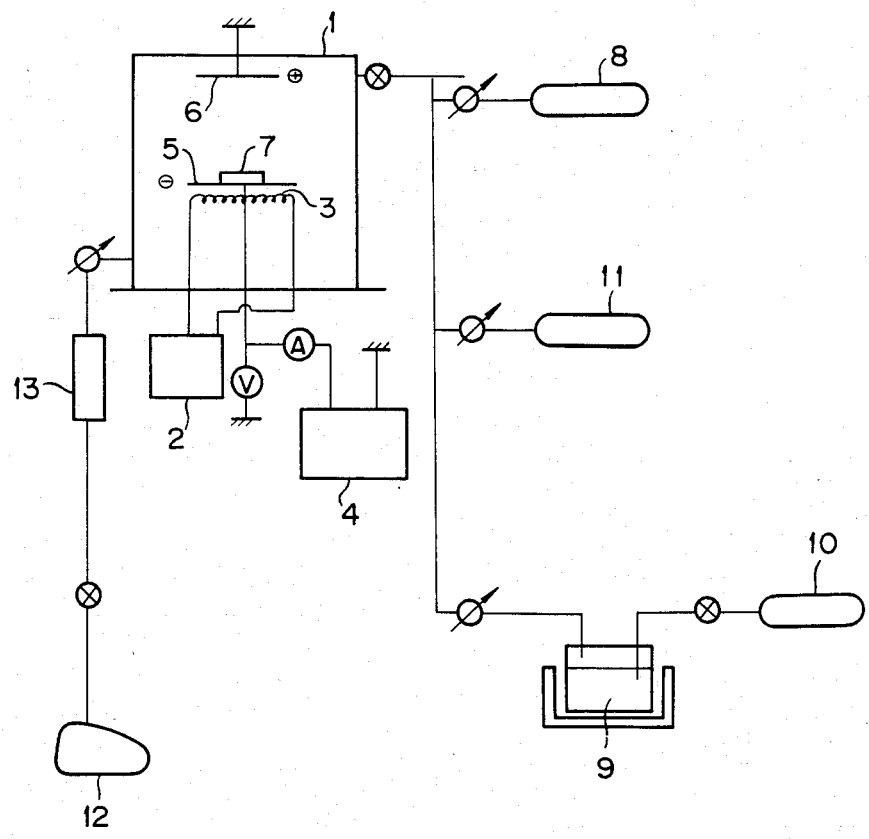

In the present ornament, the thin film of silicon carbide which has been coated on the surface thereof has a color tone in which, in the CIE 1976 L*a*b* color space provided in JIS Z 8105-1982 Item No. 2068, each of L*, a* and b* satisfies the relationship of $30\% \leq L^* \leq 50\%$, and $(a^*)^2 + (b^*)^2 \leq 25$.

Here, the CIE 1976 L*a*b* color space is one of the uniform color spaces prescribed by CIE (Commission Internationale de Enluminure) in 1976, in which the following three-dimensional rectangular coordinates are used.

$$L^* = 116 \left(\frac{Y}{Y_n}\right)^{\frac{1}{3}} - 16 \qquad \frac{Y}{Y_n} > 0.008856$$

$$a^* = 500 \left[\left(\frac{X}{X_n}\right)^{\frac{1}{3}} - \left(\frac{Y}{Y_n}\right)^{\frac{1}{3}}\right] \qquad \frac{X}{X_n} > 0.008856$$

$$b^* = 200 \left[\left(\frac{Y}{Y_n}\right)^{\frac{1}{3}} - \left(\frac{Z}{Z_n}\right)^{\frac{1}{3}}\right] \qquad \frac{Z}{Z_n} > 0.008856$$

wherein,
X, Y, Z: tristimulus values of XYZ color system (the CIE 1931 standard colorimetric system) or $X_{10}Y_{10}Z_{10}$ color system (the CIE 1964 supplementary standard colorimetric system)
$X_n$, $Y_n$, $Z_n$: tristimulus values of a specified white object (perfect reflecting diffuser)

When this color tone is provided, the thin film of silicon carbide shines with an elegant black luster. If L* is too small, the lightness of the surface of the thin film will become lower so that the luster is unsatisfactory. When L* is excessively high, the lightness will become so high that the color is a metallic one (of metallic luster) and no longer a black one. Accordingly, L* is preferably between 30% and 50%, and more preferably between 35% and 45%. Further, if $(a^*)^2 + (b^*)^2$ is too great, on the surface of the thin film, the chromaticness of the hue of red (or its complementary color; green) or yellow (or its complementary color; blue) would become stronger than black, and it could hardly be called a satisfactory black any longer. Therefore, $(a^*)^2 + (b^*)^2$ is preferably not more than 25, more preferably not more than 16.

The thin film of silicon carbide of the present invention can be formed through the process of plasma-assisted chemical vapor deposition (PCVD method), using the apparatus as illustrated below in the schematic diagram.

In the drawing, the numeral 1 indicates a reaction chamber, and in the chamber arranged are heater 3 connected to heater power source 2, and, provided thereover, negative electrode (cathode) 5 connected to D.C. power source for electrical discharge 4, and positive electrode (anode) 6 opposite to negative electrode 5. The negative electrode functions also as a support plate for substrate 7 to be subjected to surface-treatment.

To reaction chamber 1 is connected a supply system of reactant gases (starting materials) and argon (the system shown on the right side of the drawing), into which each material is introduced at a predetermined rate. A reactant gas mixture in this context comprises three kinds of gases: hydrogen ($H_2$), a silicon compound and a hydrocarbon. In the drawing, the numeral 8 indicates a cylinder from which a hydrocarbon is supplied. As the suitable hydrocarbon to be used, there may be mentioned methane, ethane, propane, ethylene, acetylene, propylene and the like, but the hydrocarbons with an excessive number of carbon atoms are not preferred in view of the handling problems associated therewith. As the silicon compound, there may be mentioned, for example, silicon tetrachloride and silane.

The numeral 9 indicates a container which is kept at a constant temperature in a constant-temperature bath (a bubbler type bath with a thermostat) where silicon tetrachloride, for example, is used as the silicon compound. The silicon tetrachloride which is contained therein is made to bubble hydrogen from hydrogen cylinder 10 and is introduced together with $H_2$ into reaction chamber 1 at a vapor pressure corresponding to the temperature of said constant temperature bath 9. At this time, the temperature of the bath 9 is determined by the quantity of $SiCl_4$ to be supplied, and is normally within the range of $-70°$ to $10°$ C.

argon cylinder 11 is for use in Argon (Ar) sputtering for the purpose of cleaning the surface of said substrate prior to the coating of the surface of substrate 7 with a thin film of silicon carbide.

In addition, the numeral 12 indicates a vaccum pump for adjusting the gas pressure of the inside of reaction chamber 1 to a predetermined value, the numeral 13 indicates a trap for prevention of a reverse flow of oil from the vacuum pump and for retaining a chloride which is produced as a by-product during the formation of the thin film of silicon carbide, and these as a whole form the exhaust system.

The apparatus shown in the drawing is used as follows:

In the first place, the pressure of Ar atmosphere in reaction chamber 1 is adjusted to approx. 0.05 Torr by evacuating the chamber by means of vacuum pump 12 while introducing an appropriate quantity of Ar gas from the gas supply system. Then, the surface of substrate 7 is cleaned by sputtering at a current density of approx. 0.5 mA/cm$^2$.

Thereafter, after changing the gas supply system to a reactant gas supply system, the reaction chamber is evacuated while introducing reactant gases ($H_2+SiCl_4+CH_4$) thereinto. While adjusting the total pressure of the reactant gases to a predetermined value, substrate 7 is heated by heater 3, and glow discharge is caused in reaction chamber 1 by applying a voltage between both electrodes 5 and 6.

In cases where the gas pressure in the chamber is lower than 0.05 Torr, glow discharge will not be caused. On the other hand, if the gas pressure is over 5 Torr, not only glow discharge will be unstable, but also arc discharge will begin to occur. Therefore, the gas pressure is preferably between 0.5 and 2 Torr.

The heating temperature of the substrate is between $100°$ and $1000°$ C., preferably between $300°$ and $700°$ C., and most preferably $500°$ C.

The current density of an electric current which is allowed to flow per unit area of the substrate at the time of electrical discharge, is between 0.01 and 1 mA/cm$^2$, preferably between 0.05 and 0.5 mA/cm$^2$.

The other operating parameters the apparatus, for instance, a voltage for maintaining discharge, a flow rate of a reactant gas, reaction time and so on, cannot be determined unconditionally because said parameters have to be changed according to variations of the above-mentioned three conditions as the amount of reaction and the surface area of the substrate are changed.

An important aspect of the formation of thin films of silicon carbide with the present invention is to control the number of carbon atoms and of silicon atoms in the above-mentioned reactant gas mixture at a predetermined ratio.

Namely, the amount of supply of each reactant gas should be controlled so that, in the reactant gas mixture, $$\frac{n}{n+n'}$$

is preferably not less than 0.75, assuming that the number of carbon atoms in the reactant gas mixture is n, and that of silicon atoms therein is n'.

If this ratio is too small, the thin film of silicon carbide formed cannot provide a desirable color tone because of too high lightness thereof; the ratio is preferably between 0.8 and 0.9.

When forming the present silicon carbide thin film, unless the thin film is so formed that the surface roughness thereof is 10 μm or less, desirable luster cannot be obtained. The surface roughness is preferably 1 μm or less.

Further, in the formation of the present silicon carbide thin film, if the thickness of the film is less than 1 μm, an interference color with interference fringes appears, since the film to be formed is a translucent film. Therefore, for the purpose of obtaining an elegant black luster, the thickness of a formed thin film should be not less than 1 μm. The preferred thickness of the film is approximately between 1.5 and 2.5 μm.

In addition, for the substrate to be surface-treated, any material may be used, so long as it can be employed as a substrate of ornaments such as a case of a watch and a frame of eyeglasses, with the surface roughness thereof being 20 μm or less, preferably being 1 μm or less, and at the same time can withstand the temperature applied where forming the thin film mentioned above. Metals or ceramics (including glass) are exemplary. If a metal is used as the substrate, it is conductive and silicon carbide is readily deposited thereon. If a ceramic is used, it is possible to provide an ornament on which an impression can hardly be formed ornacust of the hardness of the substrate.

Examples 1 to 3, and Comparative Examples 1 to 4

Using the apparatus illustrated in the drawing, and at the same time under the conditions tabulated in the Table, the mirror-finished surfaces of a nickel-base hard alloy block and a case of a watch were coated with a thin film of silicon carbide.

Comparative Example 5

Using the apparatus illustrated in the drawing, and at the same time under the conditions tabulated in the Table, the surfaces of a nickel-base hard alloy block and a case of a watch having the surface roughness of not less than 20 μm were coated with a thin film of silicon carbide.

Comparative Example 6

Using the ion plating method, the surfaces of a nickel-base hard alloy block and a case of a watch were coated with a thin film of titanium. That is to say, a nitrogen gas was introduced into a reaction chamber and after controlling the pressure of the nitrogen gas to $5 \times 10^{-3}$ Torr, titanium was evaporated using an electron beam of 8 kV and 300 mA, under the D.C. voltage of 2 kV applied between a cathod and an evaporation source, while rotating the substrate and maintaining the temperature at 200° C. Thus the ion plating was carried out over a period of ten minutes.

As to these thin films of Examples 1 to 3 and Comparative Examples 1 to 6, the hardness of each thin film was measured by means of a micro-Vickers tester, and the thickness thereof was obtained by measuring the level difference formed upon shadowing each thin film using a surface roughness meter. Further, the color tone thereof was quantified by converting the values of spectral reflectance provided in JIS Z 8105-1982, Item No. 1013 which had been obtained by using the CIE standard illuminant C provided in JIS Z 8105-1982, Item No. 2014, into the L*a*b* color space. In addition, the color tone of each thin film was also observed visually.

The results are collectively shown in the Table below.

TABLE

| | Substrate surface roughness (μm) | Ratio of mixed reactant gases | | | | Conditions for formation of SiC thin film | | | | |
|---|---|---|---|---|---|---|---|---|---|---|
| | | H₂ | SiCl₄ | CH₄ | $\frac{C}{Si+C}$ | *1 Torr | *2 (mA/cm²) | *3 (°C.) | *4 (m.) | *5 (μm) |
| | | (mole %) | | | | | | | | |
| Comparative example 1 | max. 0.1 | 95 | 5 | — | 0 | 1.0 | 0.15 | 500 | 180 | 1.0 |
| Comparative example 2 | max. 0.1 | 93 | 5 | 2 | 0.29 | 1.5 | 0.30 | 500 | 90 | 1.3 |
| Comparative example 3 | max. 0.1 | 90 | 5 | 5 | 0.50 | 2.0 | 0.30 | 500 | 90 | 1.5 |
| Comparative example 4 | max. 0.1 | 85 | 5 | 10 | 0.66 | 1.0 | 0.45 | 500 | 60 | 1.5 |
| Comparative example 5 | min. 20 | 75 | 5 | 20 | 0.80 | 1.0 | 0.30 | 500 | 90 | 1.8 |
| Comparative example 6 | max. 0.1 | (Ti coating by ion plating) | | | | | | | | |
| Example 1 | max. 0.1 | 80 | 5 | 15 | 0.75 | 1.0 | 0.15 | 500 | 180 | 2.0 |
| Example 2 | max. 0.1 | 75 | 5 | 20 | 0.80 | 1.0 | 0.30 | 500 | 90 | 1.8 |
| Example 3 | max. 0.1 | 65 | 5 | 30 | 0.86 | 1.5 | 0.15 | 500 | 180 | 2.2 |

| | Characteristics | | | | Appearance observed with eyes | Film surface roughness (μm) | Practicability |
|---|---|---|---|---|---|---|---|
| | *6 (Hv) | L* (%) | a* | b* | | | |
| Comparative example 1 | approx. 1000 | 71 | 0.5 | 1 | whole surface silver colored glittering | max. 0.1 | not good |
| Comparative example 2 | approx. 1000 | 70 | 1 | 2 | whole surface silver colored glittering | max. 0.1 | not good |
| Comparative example 3 | — | 68 | 2 | 28 | interference color with interference fringes | max. 0.1 | good |
| Comparative example 4 | — | 50 | 6 | 15 | dark interference color with interference fringes | max. 0.1 | good |
| Comparative example 5 | approx. 3000 | 15 | 2 | 2 | sooty black | min. 10 | good |
| Comparative example 6 | — | 20 | 2 | 2 | sooty black | min. 1 | good |
| Example 1 | approx. 3000 | 40 | 3 | 2 | glossy black | max. 0.1 | very good |
| Example 2 | approx. 3000 | 40 | 2 | 2 | glossy black | max. 0.1 | very good |
| Example 3 | approx. 3000 | 40 | 2 | 2 | glossy black | max. 0.1 | very good |

*1 pressure of reactant gas mixture
*2 current density
*3 temperature
*4 time
*5 thickness of film
*6 hardness

We claim:

1. A black ornament comprising (1) a substrate with a surface roughness of 20 μm or less and (2) a high luster coating the thickness being not less than 1 μm applied to said substrate, said coating comprising silicon carbide and having a color tone in which, relative to the CIE 1976 L*a*b* color space provided in JIS Z 8105-1982, Item No. 2068, each of L*, a* and b* satisfies the relationship of $30\% \leq 50\%$, and $(a^*)^2 + (b^*)^2 \leq 25$.

2. The black ornament as claimed in claim 1, wherein said coating is a thin film having been formed by the process of plasma-assisted chemical vapor deposition.

3. The black ornament as claimed in claim 2, wherein said process of plasma-assisted chemical vapor deposition comprises the step of using a reactant gas mixture containing a number of carbon atoms represented by n and a number of silicon atoms represented by n', n and n' being numbers satisfying the relationship of $$0.75 - \frac{n}{n + n'}.$$

4. The black ornament as claimed in claim 1, wherein said coating has a thickness not less than 1 μm.

5. The black ornament as claimed in claim 1, wherein said coating has a surface roughness of 10 μm or less.

6. The black ornament as claimed in claim 1, wherein said coating consists essentially of silicon carbide.

7. The black ornament as claimed in claim 1, wherein said coating is the product of a process comprising the step of applying said silicon carbide to said substrate by plasma-assisted chemical vapor deposition using hydrogen, a silicon compound, and a hydrocarbon, said thin film having a color tone in which, relative to the CIE 1976 L*a*b* color space provided in JIS Z 8105-1982, Item No. 2068, each of L*, a* and b* satisfies the relationship of $30\% \leq L^* \leq 50\%$, and $(a^*)^2 + (b^*)^2 \leq 25$, said substrate being heated during said applying step to a temperature between about 100° and 1000° C.

* * * * *